US011515167B2

(12) United States Patent
Fujisaki et al.

(10) Patent No.: US 11,515,167 B2
(45) Date of Patent: Nov. 29, 2022

(54) PLASMA ETCHING METHOD AND PLASMA PROCESSING APPARATUS

(71) Applicant: HITACHI HIGH-TECH CORPORATION, Tokyo (JP)

(72) Inventors: Sumiko Fujisaki, Tokyo (JP); Yoshihide Yamaguchi, Tokyo (JP); Hiroyuki Kobayashi, Tokyo (JP); Kazunori Shinoda, Tokyo (JP); Kohei Kawamura, Tokyo (JP); Yutaka Kouzuma, Tokyo (JP); Masaru Izawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 338 days.

(21) Appl. No.: 16/495,515

(22) PCT Filed: Feb. 1, 2019

(86) PCT No.: PCT/JP2019/003601
§ 371 (c)(1),
(2) Date: Sep. 19, 2019

(87) PCT Pub. No.: WO2020/157954
PCT Pub. Date: Aug. 6, 2020

(65) Prior Publication Data
US 2021/0358760 A1    Nov. 18, 2021

(51) Int. Cl.
H01J 37/32    (2006.01)
H01L 21/311   (2006.01)
H01L 21/3065  (2006.01)

(52) U.S. Cl.
CPC .. H01L 21/31116 (2013.01); H01J 37/32449 (2013.01); H01J 37/32935 (2013.01);
(Continued)

(58) Field of Classification Search
CPC ........... H01L 21/31116; H01L 21/3065; H01L 21/32136; H01L 21/768; H01J 37/32935;
(Continued)

(56) References Cited

U.S. PATENT DOCUMENTS 3,562,677 A    2/1971 Gunderson
5,728,253 A    3/1998 Saito et al.
(Continued)

FOREIGN PATENT DOCUMENTS

JP    2000208524 A    7/2000
JP    2003347278 A    12/2003
(Continued)

OTHER PUBLICATIONS

International Search Report dated Apr. 23, 2019 in PCT/JP2019/003601.
(Continued)

*Primary Examiner* — Lan Vinh
(74) *Attorney, Agent, or Firm* — Miles & Stockbridge, P.C.

(57) ABSTRACT

Provided is a plasma etching method which enables etching with high accuracy while controlling and reducing surface roughness of a transition metal film. The etching is performed for the transition metal film, which is formed on a sample and contains a transition metal element, by a first step of isotropically generating a layer of transition metal oxide on a surface of the transition metal film while a temperature of the sample is maintained at 100° C. or lower, a second step of raising the temperature of the sample to a predetermined temperature of 150° C. or higher and 250° C. or lower while a complexation gas is supplied to the layer of transition metal oxide, a third step of subliming and removing a reactant generated by an reaction between the complexation gas and the transition metal oxide formed in the first
(Continued)

step while the temperature of the sample is maintained at 150° C. or higher and 250° C. or lower, and a fourth step of cooling the sample.

14 Claims, 6 Drawing Sheets

(52) U.S. Cl.
CPC ..... *H01L 21/3065* (2013.01); *H01J 2237/24585* (2013.01); *H01J 2237/3344* (2013.01)

(58) Field of Classification Search
CPC ......... H01J 37/32449; H01J 2237/3344; H01J 2237/24585; C23C 8/36; C23C 8/80; C23F 1/12; C23F 4/02
USPC ....... 438/706, 710, 712, 714, 719, 723, 758, 438/770, 715
See application file for complete search history.

(56) References Cited

U.S. PATENT DOCUMENTS

| | | | |
|---|---|---|---|
| 7,582,491 B2 | 9/2009 | Sasaki et al. | |
| 2002/0048019 A1 | 4/2002 | Sui et al. | |
| 2004/0185670 A1 | 9/2004 | Hamelin et al. | |
| 2008/0093315 A1 | 4/2008 | Okabe | |
| 2008/0102001 A1 | 5/2008 | Chandrachood et al. | |
| 2008/0268645 A1 | 10/2008 | Kao et al. | |
| 2012/0064247 A1* | 3/2012 | Hiwa | C23C 16/0281 427/250 |
| 2013/0343426 A1 | 12/2013 | Gurary et al. | |
| 2014/0251945 A1 | 9/2014 | Nishimura et al. | |
| 2015/0118858 A1 | 4/2015 | Takaba | |
| 2015/0270140 A1* | 9/2015 | Gupta | H01L 21/32136 216/67 |
| 2015/0270148 A1 | 9/2015 | Shinoda et al. | |
| 2017/0125261 A1 | 5/2017 | Miyama et al. | |
| 2017/0133233 A1* | 5/2017 | Sato | H01L 21/3065 |
| 2017/0229290 A1 | 8/2017 | Kobayashi et al. | |
| 2018/0090345 A1* | 3/2018 | Kouzuma | H01L 21/67115 |
| 2018/0122665 A1 | 5/2018 | Kobayashi et al. | |
| 2018/0197748 A1 | 7/2018 | Nishimura et al. | |
| 2019/0028725 A1 | 1/2019 | Zhang et al. | |
| 2019/0287825 A1 | 9/2019 | Tanaka | |
| 2020/0328099 A1 | 10/2020 | Kobayashi et al. | |

FOREIGN PATENT DOCUMENTS

| | | |
|---|---|---|
| JP | 2004518272 A | 6/2004 |
| JP | 2007234859 A | 9/2007 |
| JP | 2014170894 A | 9/2014 |
| JP | 2015012243 A | 1/2015 |
| JP | 2015522953 A | 8/2015 |
| JP | 2015185594 A | 10/2015 |
| JP | 2016178257 A | 10/2016 |
| JP | 2017084965 A | 5/2017 |
| JP | 2017092116 A | 5/2017 |
| JP | 2017143186 A | 8/2017 |
| JP | 2018056248 A | 4/2018 |
| JP | 2018073962 A | 5/2018 |
| JP | 2018-110230 A | 7/2018 |
| JP | 2018107202 A | 7/2018 |
| JP | 2018110229 A | 7/2018 |
| JP | 2018113306 A | 7/2018 |
| JP | 2019161157 A | 9/2019 |
| WO | 2013168509 A1 | 11/2013 |

OTHER PUBLICATIONS

Office Action dated Oct. 27, 2020 in corresponding Japanese Application No. 2019-546055.

* cited by examiner

[FIG. 1]
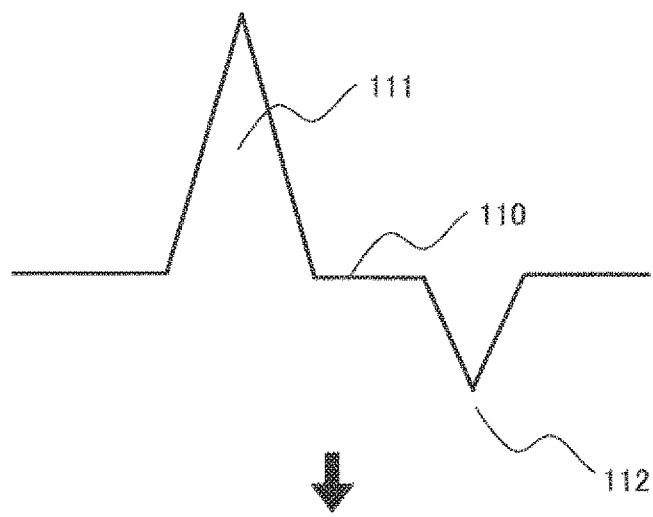
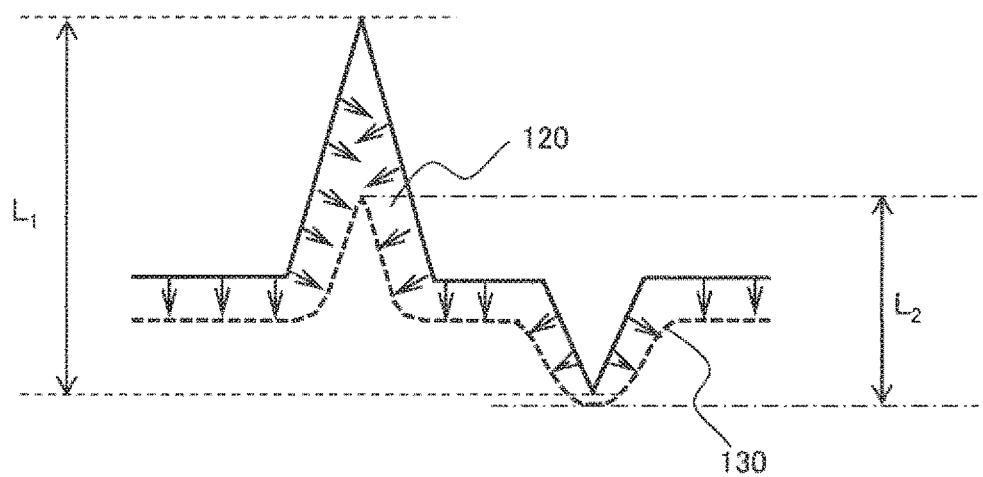
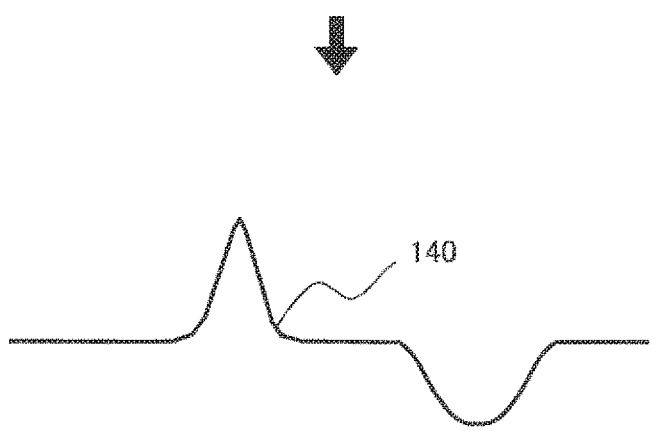

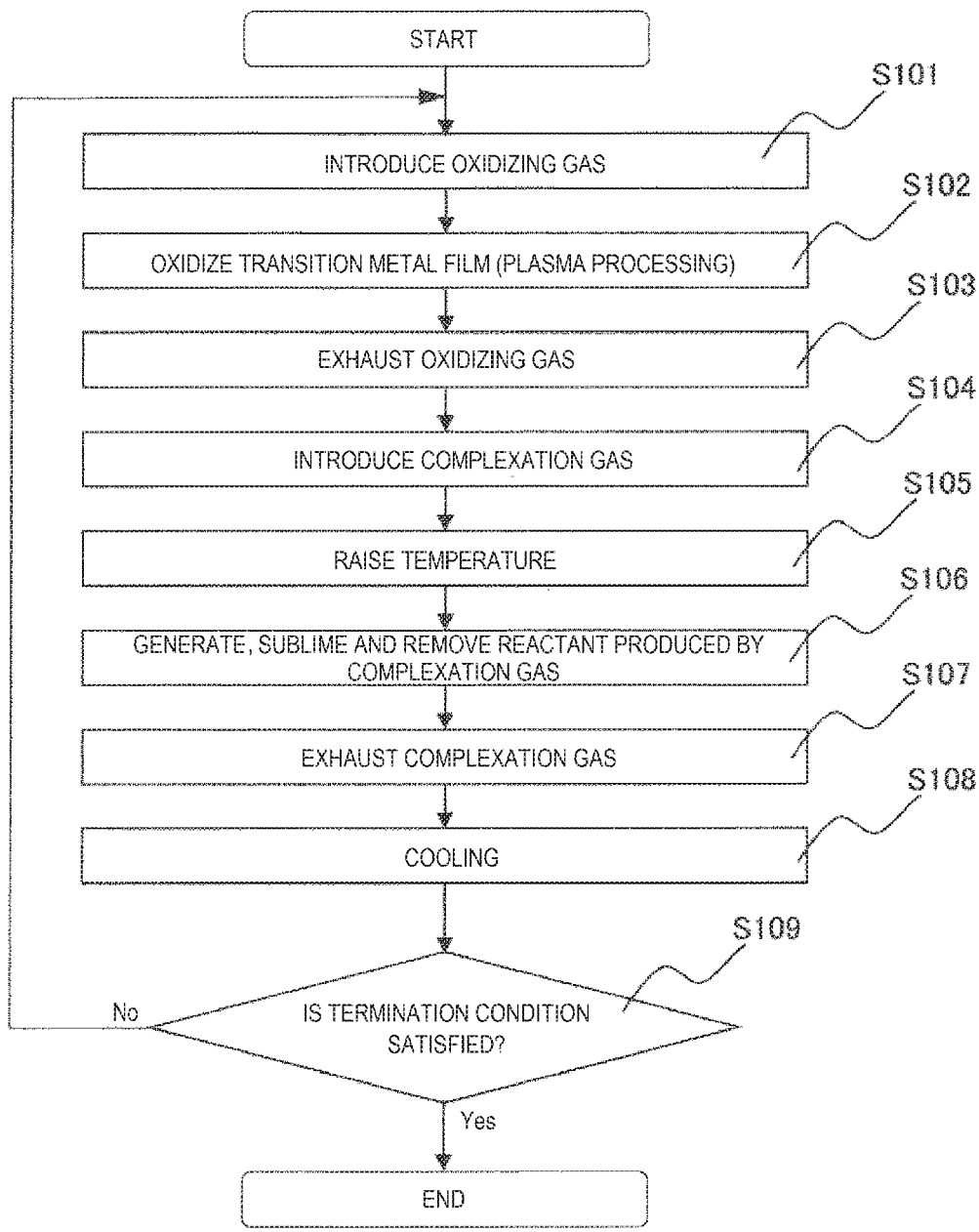
[FIG. 2]

[FIG. 3]
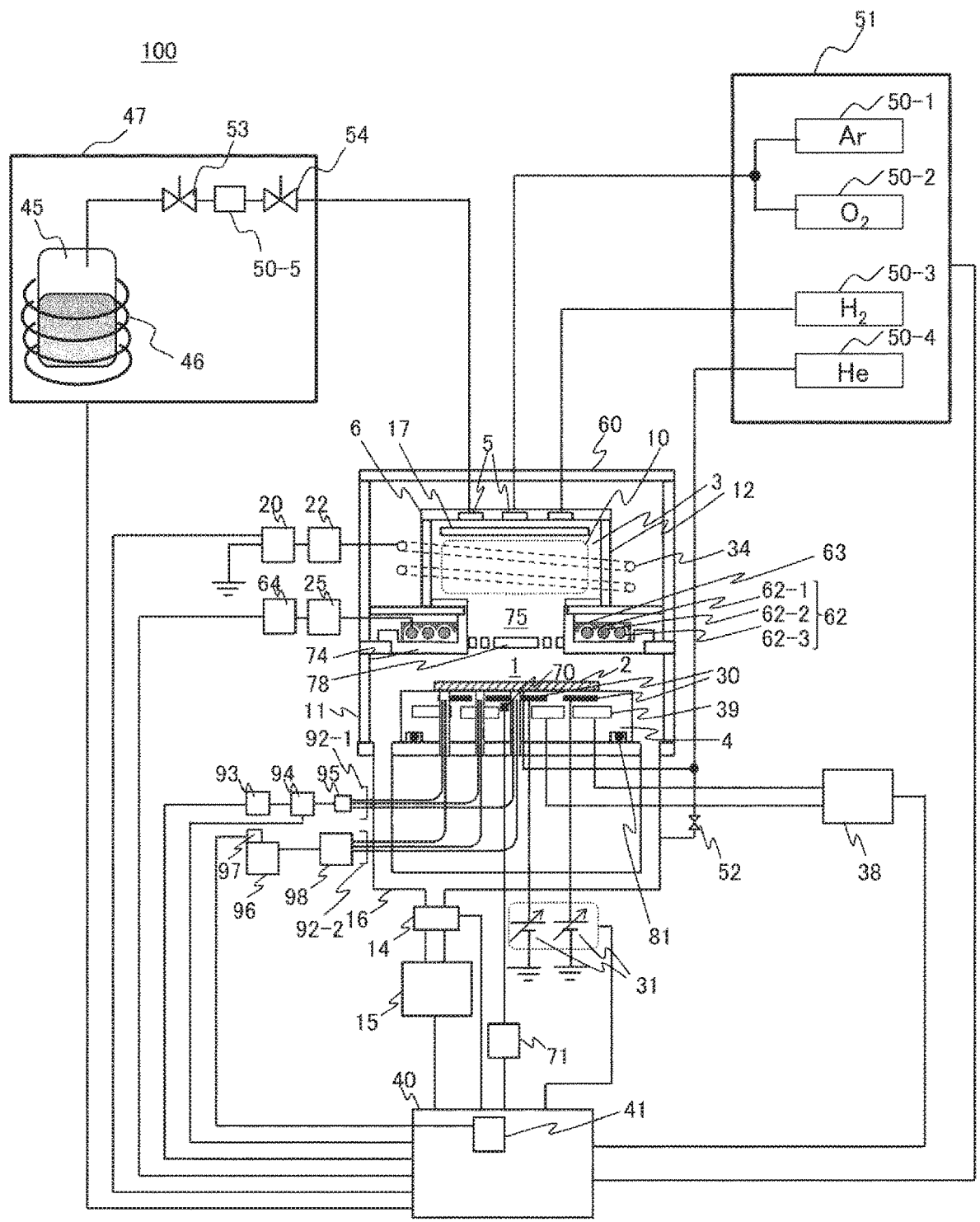

[FIG. 4]
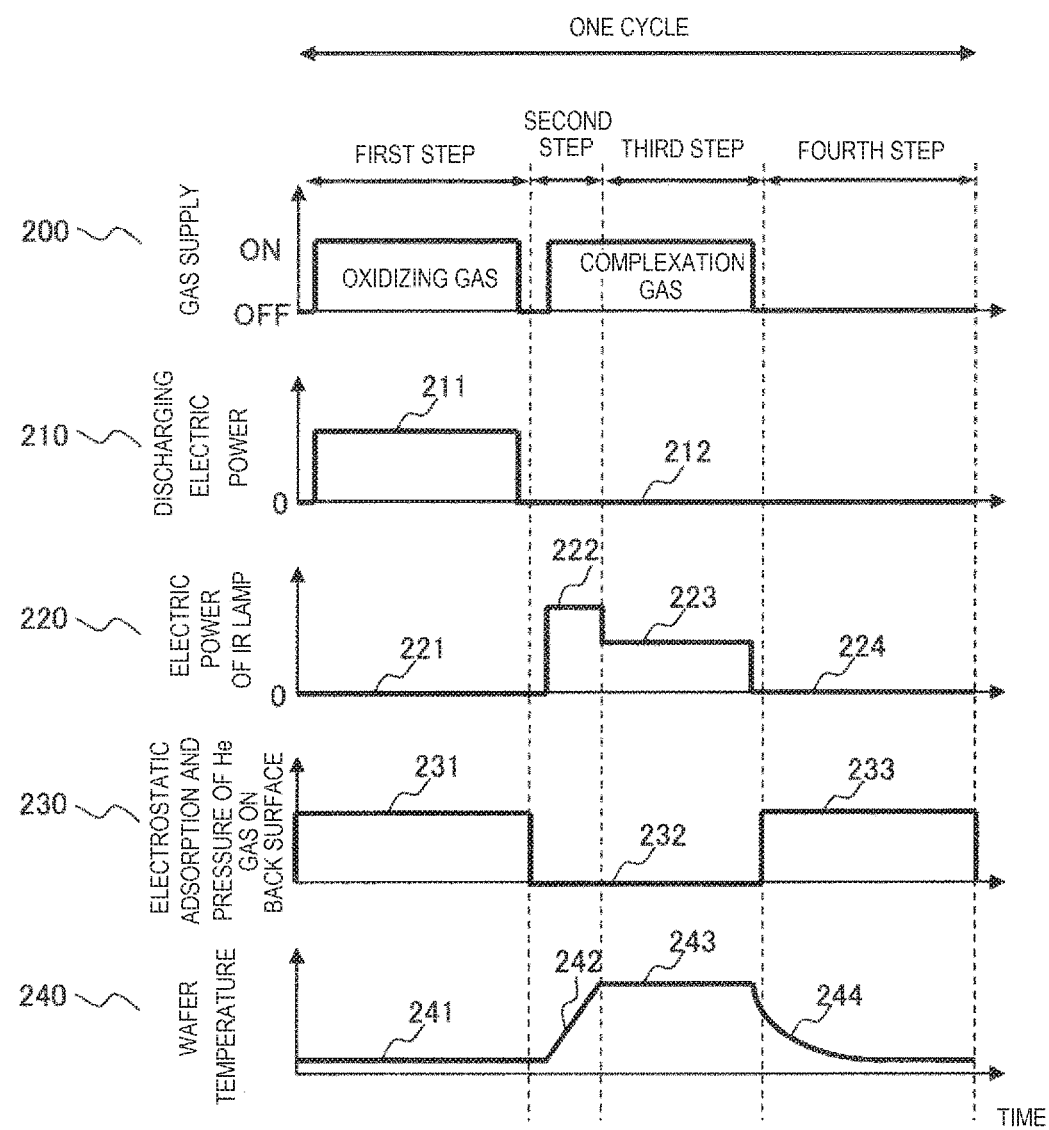

[FIG. 5]
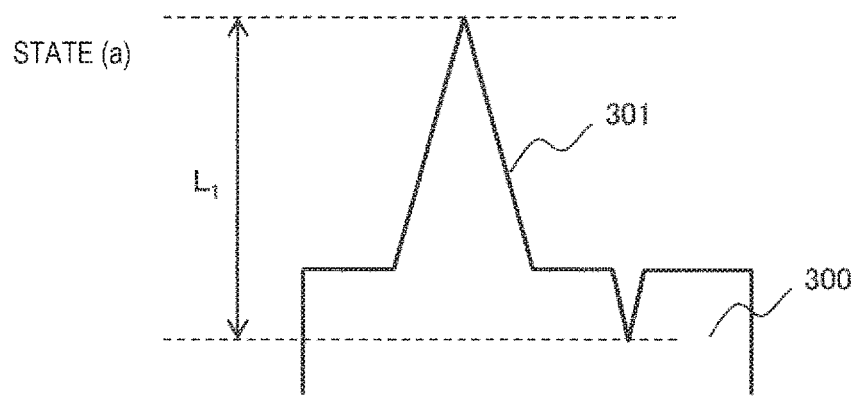
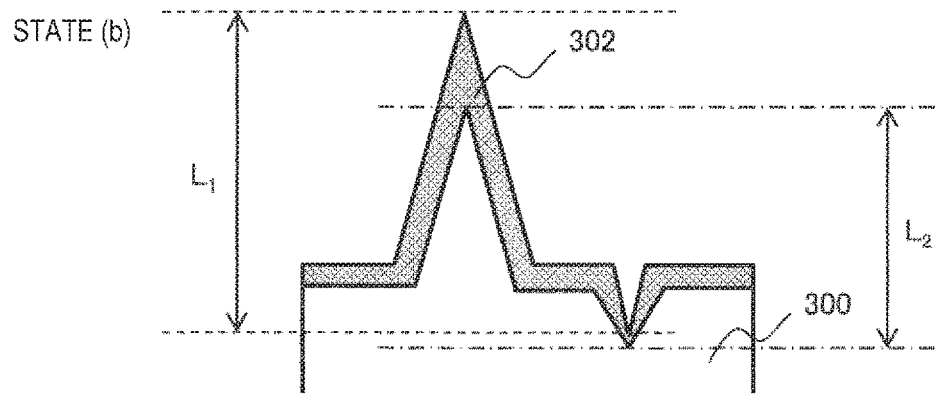
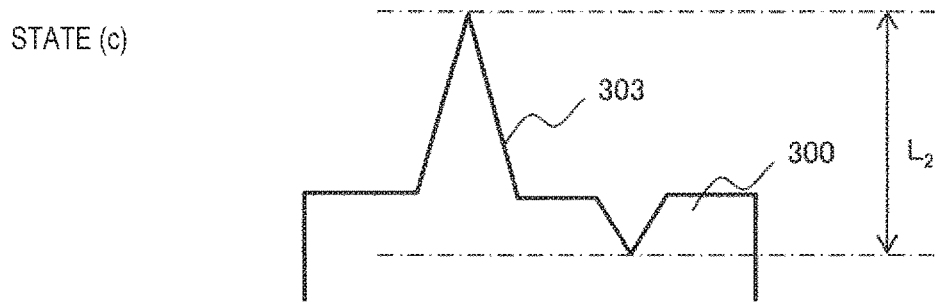

[FIG. 6]
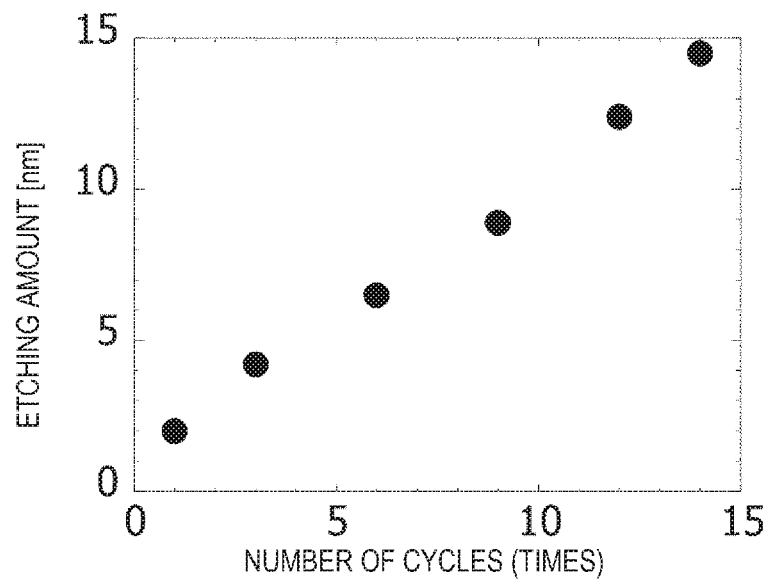
[FIG. 7]
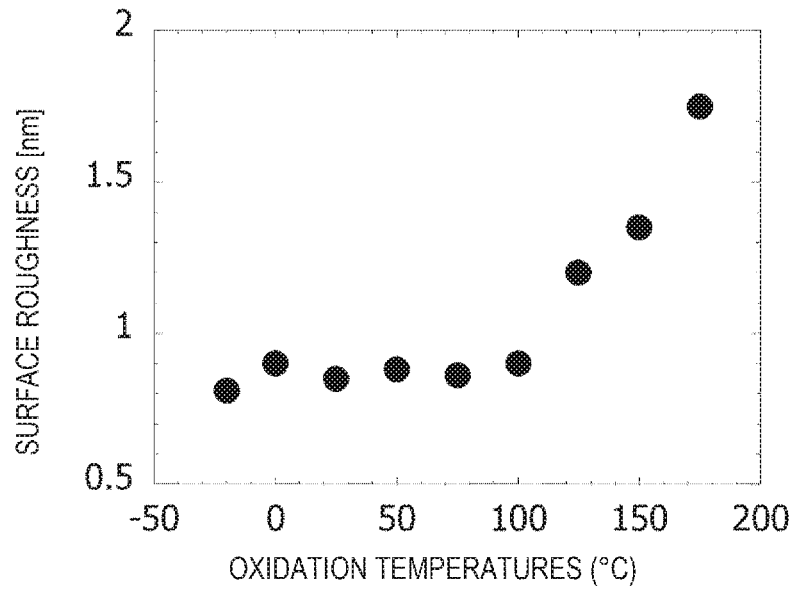

PLASMA ETCHING METHOD AND PLASMA PROCESSING APPARATUS

TECHNICAL FIELD

The present invention relates to a plasma etching method and a plasma processing apparatus in which a transition metal film containing a transition metal element is etched by using a complexation gas.

BACKGROUND ART

Electronic apparatuses have progressed in size reduction and performance in accordance with miniaturization and high integration of semiconductor devices that constitute the electronic apparatuses. When wiring for forming a circuit of a semiconductor device is miniaturized, there are concerns for Cu (copper) wiring since a barrier layer for preventing diffusion into surroundings is required, which is disadvantageous for the miniaturization, and electromigration becomes more pronounced. In addition, W (tungsten) wiring has a relatively high resistivity. Therefore, wiring using other metal materials has been studied.

A transition metal such as Co (cobalt) or Ru (ruthenium) is used as a metal material expected as a wiring material to replace Cu or W. In order to apply a transition metal film containing such a transition metal element to fine wiring, it is necessary to process the transition metal film with a high controllability at a nanometer level. In order to perform highly accurate etching in this manner, wet etching of processing a metal film using a chemical solution is difficult while dry etching using a gas is promising.

For example, PTL 1 discloses a dry etching method using an etching gas in which a β-diketone and an oxidizing gas such as NO, $N_2O$, $O_2$ or $O_3$ are added to a metal film formed of a metal element capable of forming a complex with the β-diketone. In particular, in order to prevent variation in an etching rate, it is disclosed that a water content of the etching gas is 30 mass ppm or less with respect to the β-diketone.

PTL 2 also discloses a dry etching method using a β-diketone, that is, a dry etching method using an etching gas to which the β-diketone, a first additive gas that is an oxidizing gas, and a second additive gas that is $H_2O$ or $H_2O_2$ are added. In particular, it is disclosed that an amount of the β-diketone and an amount of the second additive gas in the etching gas are optimized in order to increase an etching rate.

PTL 3 discloses an etching method for a transition metal film. The etching method includes, in etching of the transition metal film, an oxidation step of anisotropically forming a metal oxide layer by a first gas containing oxygen ions, and a complexation and etching step of performing etching by introducing a second gas to complex the metal oxide layer and forming a metal complex in the metal oxide layer. An example of the second gas includes a β-diketone gas.

PRIOR ART LITERATURE

Patent Literature

PTL 1: JP-A-2018-110230
PTL 2: JP-A-2018-110229
PTL 3: JP-A-2017-84965

SUMMARY OF INVENTION

Technical Problem

In order to fabricate a miniaturized semiconductor device by processing a thin film, a high demand is placed on etching for processing the thin film. Specifically, variation in an etching amount of a wafer surface needs to be controlled to a predetermined value, for example, 1 nm or less, so that uniform processing is performed on an entire surface of the wafer. An interface of the thin film after processing has a large influence on device characteristics. Therefore, surface roughness of the thin film after etching also needs to be controlled to an extent of the above-mentioned variation in the etching amount of the wafer surface.

For example, in a case of a metal film containing Co, inventors have found that Co oxide is likely to change into a granular or columnar shape at a temperature of about 100° C. or higher. Specifically, it has been found that a generated Co oxide film is granular or columnar at a temperature of 100° C. or higher when an oxygen gas is used as an oxidizing gas, even when a film surface is irradiated with oxygen ions by generating oxygen plasma using a plasma source, with oxygen radicals by blocking oxygen ions and electrons with an ion shielding plate, or with an oxygen gas without using a plasma source. When etching is performed using an etching gas in which the oxidizing gas is added to the β-diketone as in PTL 1 and PTL 2, a complex formed by a reaction of the β-diketone and Co has to be processed in a temperature range where the complex can be vaporized. Accordingly, a temperature of a substrate needs to be 100° C. or higher. Therefore, generation of the Co oxide film and the etching by complexation proceed simultaneously, and Co oxide generated at this time is granular or columnar. As a result, it is difficult to control the etching amount with high accuracy or control surface roughness of the metal film after etching.

Therefore, it is desirable to separate an oxidation step of oxidizing a transition metal to generate a metal oxide layer from a complexation step of complexing the metal oxide layer to form a metal complex, and to perform each processing under appropriate conditions. PTL 3 discloses the etching method in which the oxidation step is separated from the complexation step. However, the oxidation step is anisotropically performed to give directionality to the etching. In this case, it has been found that surface roughness remains in the metal film containing the transition metal after etching, and the surface roughness may increase during the etching.

Solution to Problem

An aspect of the invention provides an etching method for a transition metal film that is formed on a sample and contains a transition metal element. The etching method includes: a first step of isotropically generating a layer of transition metal oxide on a surface of the transition metal film while a temperature of the sample is maintained at 100° C. or lower; a second step of concurrently raising the temperature of the sample to a predetermined temperature of 150° C. or higher and 250° C. or lower and supplying a complexation gas to the layer of transition metal oxide, and chemisorbing and activating materials of the complexation gas absorbed on the surface of the layer of the transition metal oxide which is obtained in the first step; a third step of subliming and removing a reactant generated by an reaction between the complexation gas and the transition metal oxide formed in the first step while the temperature of the sample is maintained at 150° C. or higher and 250° C. or lower; and a fourth step of cooling the sample.

Another aspect of the invention provides a plasma processing apparatus. The plasma processing apparatus includes: a plasma source; a processing chamber provided with a stage on which a sample is placed, a transition metal film that contains a transition metal element being formed on the sample; a gas supply unit that supplies an oxidizing gas to the plasma source; a complexation gas supplier that supplies a complexation gas to the processing chamber; a slit plate disposed between the plasma source and the stage; an exhaust mechanism that exhausts the processing chamber; and a control unit. The control unit executes: a first step of, while a temperature of the sample is maintained at 100° C. or lower, generating a layer of transition metal oxide on a surface of the transition metal film and thereafter exhausting the processing chamber by the exhaust mechanism, the layer of transition metal oxide being generated by generating plasma while the oxidizing gas is supplied from the gas supply unit to the plasma source and irradiating the sample with a neutral oxidizing gas and a neutral radical that pass through the slit plate; a second step of raising the temperature of the sample to a predetermined temperature of 150° C. or higher and 250° C. or lower while the complexation gas is supplied from the complexation gas supplier to the processing chamber, and chemisorbing and activating materials of the complexation gas absorbed on the surface of the layer of the transition metal oxide; a third step of subliming a reactant generated by a reaction between the complexation gas and the transition metal oxide formed in the first step while the temperature of the sample is maintained at 150° C. or higher and 250° C. or lower and thereafter exhausting the processing chamber by the exhaust mechanism; and a fourth step of cooling the sample.

Advantageous Effect

Surface roughness of a transition metal film can be controlled and reduced, and etching can be performed with high accuracy.

Other problems and novel features will be apparent from the description of the present specification and the accompanying drawings.

BRIEF DESCRIPTION OF DRAWINGS

FIG. 1 schematically shows states of etching of a transition metal film.

FIG. 2 is a process flow chart of performing the etching of the transition metal film.

FIG. 3 is a sectional view illustrating a schematic configuration of a plasma processing apparatus.

FIG. 4 is a time chart of an etching step (one cycle).

FIG. 5 schematically shows changes in a state near a surface of the film containing Co in the etching step (one cycle).

FIG. 6 shows dependency between an etching amount and the number of cycles.

FIG. 7 shows dependence between surface roughness caused by etching and an oxidation temperature.

DESCRIPTION OF EMBODIMENTS

Hereinafter, an embodiment of the invention will be described with reference to the accompanying drawings. In the specification and the accompanying drawings, components having substantially the same functions are denoted by the same reference numerals, and repeated description thereof will be omitted.

As a result of a detailed study of an oxidation process of Co by the present inventors, it has been found from the oxidation process of Co that (1) a diffusion phenomenon in which a Co ion and an oxygen ion diffuse in a Co oxide layer and (2) an interfacial reaction of oxygen at a Co surface in an oxidizing atmosphere as well as an interfacial reaction between a Co metal and the Co oxide layer where Co metal atoms from a Co metal layer enter the Co oxide layer proceed simultaneously, a balance therebetween changes with a temperature, and a critical temperature of whether a Co oxide grows three-dimensionally in relation thereto is 100° C. A thickness of an oxide layer generated at a low temperature of 100° C. or lower is, for example, as thin as about 5 nm. As a result, three-dimensional growth is prevented, and granulation and columnar formation are less likely to occur.

In particular, in the embodiment of the invention, it is possible to control or even reduce an increase in surface roughness by isotropically performing an oxidation step. FIG. schematically shows states of etching of a metal film (hereinafter, referred to as a "transition metal film") that contains a transition metal element and has an uneven shape on a film surface due to surface roughness according to the present embodiment. The transition metal film includes, in addition to a transition metal single film, a metal film configured with a plurality of elements including the transition metal element. For the sake of easy understanding, unevenness of a surface is emphasized in the drawing.

As described above, oxidation proceeds isotropically and a metal layer-oxide layer interface moves at a constant rate by controlling the temperature of the oxidation process. Here, as shown in FIG. 1, a convex portion 111 and a concave portion 112 exist on a surface 110 of the transition metal film before etching. In the convex portion 111, oxidation proceeds more locally since an amount of oxygen that reaches and diffuses in the convex portion 111 is larger than those in other portions, and a thickness of a generated oxide layer is increased. On the other hand, in the concave portion 112, the amount of oxygen that reaches and diffuses in the concave portion 112 is smaller than those in other portions, and therefore the oxidation does not proceed locally. In this manner, a relatively thick oxide layer is formed in the convex portion 111, and a relatively thin oxide layer is formed in the concave portion 112.

A generated oxide layer 120 is removed thoroughly by an etching step using a complexation gas, whereby a metal layer-oxide layer interface 130 appears as a surface 140 of the transition metal film after etching. When surface roughness of the surface 110 of the transition metal film before etching is L1 and surface roughness of the surface 140 of the transition metal film after etching is L2, a relationship of L1>L2 is established, and therefore unevenness of the transition metal film is reduced. The step shown in FIG. 1 is repeatedly performed as one cycle, whereby the unevenness on the surface of the transition metal film is reduced, and a surface shape is flattened. As long as oxidation conditions are properly controlled, the oxidation proceeds isotropically and the flat metal layer-oxide layer interface is not disordered. When the oxidation proceeds isotropically, the unevenness on the surface of the transition metal film is reduced. As a result, regardless of a state of the surface roughness of the transition metal film before etching, the film surface of the transition metal film after etching can be flattened, and good device characteristics can be obtained.

FIG. 2 is a process flow chart of performing etching of the transition metal film. Hereinafter, each step will be described.

In step S101, an oxidizing gas is introduced into a processing chamber of a plasma processing apparatus in which a sample (for example, a wafer) is placed. A transition metal film is formed on the sample. When a metal oxide element is Co, the transition metal film is a metal film containing Co and includes a FeCo film, a NiCo film, and a CoPt film and the like, in addition to a Co single film. As the oxidizing gas, ozone, nitric oxide and the like may be used in addition to oxygen. A temperature of the sample in this step is adjusted to 100° C. or lower.

In step S102, the oxidizing gas is activated by plasma generated with a plasma source, and an oxide layer is generated on a surface of the metal film containing Co. A thickness of the generated oxide layer depends on oxidation conditions. At this time, in order to not increase surface roughness of the oxide layer, plasma processing is performed while the temperature of the sample is maintained at 100° C. or lower. However, when the temperature of the sample is too low, a difference in processing temperatures within one cycle becomes large, and temperature raising (step S105) or cooling (step S108) cannot be rapidly performed and etching throughput may be lowered. Therefore, the temperature of the sample during the plasma processing is preferably −20° C. or higher. Thereafter, the oxidizing gas is rapidly exhausted and the oxidation processing is terminated (step S103). The step of oxidizing the transition metal film based on steps S101 to S103 is referred to as a first step.

In step S104, a complexation gas is introduced into the processing chamber. The complexation gas reacts with the oxide layer of the metal film containing Co to generate a Co complex. It is preferable to use a β-diketone as the complexation gas. Hereinafter, an example of using the β-diketone as the complexation gas is shown. In this step, the temperature of the sample may be the temperature of the first step. The β-diketone is first physically adsorbed on the surface of the oxide layer generated on the surface of the metal film containing Co at a low temperature. While the β-diketone is introduced into the processing chamber, the temperature of the sample is raised to 150° C. to 250° C. (step S105). During the temperature raising, the β-diketone physically adsorbed on the surface of the oxide layer of the metal film containing Co gradually becomes more chemisorbed and is activated. The step of introducing the complexation gas and raising the temperature in steps S104 to S105 are referred to as a second step.

After the temperature raising, the temperature of the sample is maintained in a range of 150° C. to 250° C., whereby complexation and the complex that is a reactant are removed by subliming, and the etching proceeds (step S106). The complexation reaction proceeds, and a temperature of 150° C. or higher is required to sublime the generated reactant. However, when the temperature exceeds 250° C., the β-diketone starts to polymerize. When a polymer having a large molecular weight is generated, it is difficult for the etching to proceed. When the temperature exceeds 300° C., the β-diketone itself is decomposed. In order to avoid the decomposition or the polymerization reaction of the complexation gas, it is desirable to set the temperature to 250° C. or lower. That is, it is required that the processing temperature of step S106 be in a range of 150° C. to 300° C., and more desirable in a range of 150° C. to 250° C. After the oxide layer generated in the first step is removed by subliming, the complexation gas is exhausted (step S107). The step of removing the oxide layer and exhausting the complexation gas in steps S106 to S107 is referred to as a third step.

A material containing no halogen element such as fluorine or chlorine in the β-diketone may be used as the complexation gas. When a β-diketone containing the halogen element such as trifluoroacetylacetone, hexafluoroacetylacetone is used, in addition to forming the Co complex, a halide of Co is also generated as a by-product in the above-mentioned range of processing temperature. A high temperature of 300° C. or higher is required for sublimation and removal of the halide of Co. Therefore, the halide of Co is not removed in the above-described range of processing temperature, but is deposited on the surface of the metal film containing Co and inhibits the reaction of forming the complex and the reaction of subliming and removing the complex. Accordingly, stability of the etching may be reduced and surface roughness after etching may be increased.

After the complexation gas is exhausted, the temperature is rapidly cooled to the processing temperature of step S101 (step S108). The cooling step of step S108 is referred to as a fourth step.

The first to the fourth steps configured with steps S101 to S108 are cyclically repeated, and it is determined whether a termination condition is satisfied (step S109). When the termination condition is satisfied, the etching is terminated. The termination condition, for example, is to determine whether a desirable etching amount is obtained.

The plasma processing apparatus that performs etching of the film containing Co as described above will be described. FIG. 3 is a sectional view illustrating a schematic configuration of a plasma processing apparatus 100.

A processing chamber 1 is configured with a base chamber 11; a wafer stage 4 (hereinafter, referred to as stage 4) on which a wafer 2 serving as a sample to be processed is placed is disposed in the processing chamber 1. A plasma source, which includes a quartz chamber 12, an ICP coil 34, and a high frequency electric power supply 20, is disposed in a container 60 disposed above the base chamber 11. In the example, an inductively coupled plasma (ICP) electric discharge method is used for the plasma source. The high frequency electric power supply 20 that generates plasma is connected to the ICP coil 34 outside the cylindrical quartz chamber 12 via a matching unit 22. A frequency band of tens of MHz, such as 13.56 MHz, is used as a frequency of high frequency electric power.

A top plate 6 is disposed at an upper portion of the quartz chamber 12. Shower plates 5 are disposed in the top plate 6. A gas dispersion plate 17 is disposed below the top plate 6. The processing gas is introduced into the processing chamber 1 from an outer periphery of the gas dispersion plate 17.

A supply flow rate of the processing gas is adjusted by mass flow controllers 50 disposed for each type of gas in the processing gas. FIG. 3 illustrates an example of using $H_2$, $O_2$, and Ar as the processing gas. However, gas types in the processing gases are not limited thereto.

On the other hand, when the β-diketone is used as the complexation gas, a liquid raw material (liquid complexation agent) is used. For this reason, a complexation gas supplier 47 vaporizes the liquid complexation agent. The complexation gas supplier 47 includes a tank 45 that houses the liquid complexation agent. The liquid complexation agent is heated by a heater 46 that covers a periphery of the tank 45, so that an upper portion of the tank 45 is filled with vapor of the liquid complexation agent. The generated complexation gas is introduced into the processing chamber 1 with a flow rate of the generated complexation gas controlled by the mass flow controller 50-5. When the complexation gas is not introduced into the processing chamber 1, valves 53 and 54 are closed, and the liquid complexation agent is shut off from the processing chamber 1.

A vacuum exhaust pipe 16 is connected to a pump 15 to reduce pressure at a lower portion of the processing chamber 1. The pump 15 is configured with, for example, a turbo molecular pump, a mechanical booster pump, or a dry pump. In order to adjust pressure of an electric discharge region 3 in the processing chamber 1 or the quartz chamber 12, a pressure adjustment mechanism 14 is disposed upstream of the pump 15. The pressure adjustment mechanism 14, the pump 15, and the vacuum exhaust pipe 16 are collectively referred to as an exhaust mechanism. The stage 4 is provided with an O-ring 81 that performs vacuum-sealing between the stage 4 and a bottom surface of the base chamber 11.

An infrared (IR) lamp unit that heats the wafer 2 is disposed between the stage 4 and the quartz chamber 12 that constitutes the ICP plasma source. The IR lamp unit mainly includes an IR lamp 62, a reflection plate 63 that reflects IR light, and an IR light transmission window 74. A circular (round-shaped) lamp is used as the IR lamp 62. Light (electromagnetic wave) emitted from the IR lamp 62 is light (herein referred to as IR light) mainly including light from visible light to light in an infrared light region. In the example, the IR lamp 62 includes IR lamps 62-1, 62-2, and 62-3 for three rounds. However, the IR lamp 62 may include IR lamps for two or four rounds. The reflection plate 63 that reflects the IR light downward (in a placement direction of the wafer 2) is disposed above the IR lamp 62.

An IR lamp electric power supply 64 is connected to the IR lamp 62. A high frequency cut-off filter 25 is disposed between the IR lamp electric power supply 64 and the IR lamp 62. The high frequency cut-off filter 25 prevents noise of high frequency electric power for generating plasma produced by the high frequency electric power supply 20 from flowing into the IR lamp electric power supply 64. The IR lamp electric power supply 64 has a function of independently controlling electric power supplied to the respective IR lamps 62-1, 62-2 and 62-3, so that radial distribution of a heating amount of the wafer 2 can be adjusted.

In the example, a gas flow path 75 is formed in a center of the IR lamp unit since the gas supplied into the quartz chamber 12 flows into the processing chamber 1. The gas flow path 75 is provided with a slit plate (ion shielding plate) 78 that shields ions and electrons in the plasma generated inside the quartz chamber 12 and that transmits only a neutral gas or neutral radicals to irradiate the wafer 2. The slit plate 78 includes a plurality of holes.

On the other hand, a refrigerant flow path 39 is formed in the stage 4 to cool the stage 4; a refrigerant is supplied and circulated by a chiller 38. In order to fix the wafer 2 to the stage 4 by electrostatic adsorption, electrodes 30 for electrostatic adsorption, which are plate-shaped electrode plates, are embedded in the stage 4. DC electric power supplies 31 for electrostatic adsorption are respectively connected to the electrodes 30 for electrostatic adsorption.

In order to efficiently cool the wafer 2, a He gas (cooling gas) can be supplied between the stage 4 and a back surface of the wafer 2 placed on the stage 4. A surface (a placement surface of the wafer) of the stage 4 is coated with resin such as polyimide to prevent the back surface of the wafer 2 from being damaged even when the electrodes 30 for electrostatic adsorption are operated to perform heating and cooling while the wafer 2 is electrostatically adsorbed. A thermocouple 70 that measures a temperature of the stage 4 is disposed inside the stage 4 and is connected to a thermocouple thermometer 71.

Optical fibers 92-1 and 92-2 are disposed at three places to measure temperatures of the wafer 2, that is, a place near a center portion of the wafer 2 placed on the stage 4, a place near a middle portion of the wafer 2 in a radial direction, and a place near an outer periphery of the wafer 2. The optical fiber 92-1 guides the IR light from an external IR light source 93 to the back surface of the wafer 2, so that the back surface of the wafer 2 is irradiated with the IR light. On the other hand, the optical fiber 92-2 collects the IR light transmitted through or reflected on the wafer 2 among the IR light emitted by the optical fiber 92-1, and transmits the transmitted or reflected IR light to a spectroscope 96.

That is, the external IR light generated by the external IR light source 93 is transmitted to an optical path switch 94 that turns on and off an optical path. Thereafter, the external IR light is branched into a plurality of pieces of light (three in this case) by a light distributor 95, and various positions on the back surface of the wafer 2 are irradiated with the plurality of pieces of IR light via three optical fibers 92-1. The IR light absorbed or reflected by the wafer 2 is transmitted to the spectroscope 96 by the optical fiber 92-2 and data of wavelength dependency of a spectral intensity is obtained by a detector 97. The data of the wavelength dependency of the spectral intensity obtained by the detector 97 is sent to an arithmetic unit 41 of a control unit 40 to calculate an absorption wavelength, and the temperature of the wafer 2 can be determined based on the absorption wavelength. An optical multiplexer 98 is disposed on an intermediate portion of the optical fiber 92-2, so that it is possible to switch light to be subjected to spectroscopic measurement at measurement points of the center of the wafer, the middle of the wafer, and the outer periphery of the wafer. Accordingly, the arithmetic unit 41 can determine the respective temperatures of the center of the wafer, the middle of the wafer, and the outer periphery of the wafer.

The control unit 40 controls each mechanism that constitutes the plasma processing apparatus 100. Specifically, the control unit 40 controls the high frequency electric power supply 20 and controls ON and OFF of a high frequency electric power supply to the ICP coil 34. A gas supply unit 51 is controlled to adjust the types and flow rates of gases supplied from the respective mass flow controllers 50-1 to 50-3 to inside of the quartz chamber 12. Alternatively, the complexation gas supplier 47 is controlled to adjust the flow rate of the complexation gas supplied from the mass flow controller 50-5 to the inside of the quartz chamber 12. When the etching gas is supplied, the control unit 40 operates the pump 15 and controls the pressure adjustment mechanism 14 to adjust pressure inside the processing chamber 1 to a desired pressure (vacuum degree).

While operating the DC electric power supplies 31 for electrostatic adsorption to electrostatically adsorb the wafer 2 to the stage 4, and operating the mass flow controller 50-4 that supplies the He gas between the wafer 2 and the stage 4, the control unit 40 controls the IR lamp electric power supply 64 and the chiller 38 based on the temperature in the stage 4 measured by the thermocouple thermometer 71 as well as information on temperature distribution of the wafer 2 determined by the arithmetic unit 41, so that the temperature of the wafer 2 falls within a predetermined temperature range. The information on temperature distribution of the wafer 2 is determined based on information on spectral intensities near the center portion of the wafer 2, near the middle portion of the wafer 2 in the radial direction, and near the outer periphery of the wafer 2, which are measured by the detector 97.

FIG. 4 is a time chart for one cycle (S101 to S108) when etching of the metal film containing Co as the transition metal element is performed by the plasma processing apparatus 100 using oxygen as the oxidizing gas and using acetylacetone that is a typical substance of the β-diketone as the complexation gas according to the flowchart of FIG. 2. FIG. 5 schematically shows changes in a state near the surface of the metal film containing Co in one cycle. Unevenness of the surface of the metal film is also emphasized and shown in the figure.

First, the wafer 2, on which the metal film containing Co to be etched is formed, is carried into the processing chamber 1 via a transport port (not shown) provided in the processing chamber 1 and is placed on the stage 4. The control unit 40 operates the DC electric power supplies 31 to electrostatically adsorb and fix the wafer 2 to the stage 4, and controls the gas supply unit 51 to supply the He gas for wafer cooling between the back surface of the wafer 2 and the stage 4 from the mass flow controller 50-4 corresponding to the He gas, so that pressure 230 of the He gas between the back surface of the wafer 2 and the stage 4 is set to a predetermined pressure 231 and a wafer temperature 240 is set to a temperature 241. In the example, the wafer temperature 241 is 20° C. However, the temperature 241 of the wafer may be in a range of −20° C. to 100° C.

Subsequently, the control unit 40 adjusts a flow rate of oxygen, which is the oxidizing gas supplied into the processing chamber 1 by the mass flow controller 50-2, and adjusts an opening degree of the pressure adjustment mechanism 14, so that pressure inside the processing chamber 1 and pressure inside the quartz chamber 12 are set to target pressure. In the state, the control unit 40 turns on the high frequency electric power supply 20 to apply discharging electric power 211, thereby starting plasma electric discharge inside the quartz chamber 12 and generating plasma 10 inside the quartz chamber 12. At this time, since the temperature of the wafer 2 is maintained at 20° C., an electric power 220 applied to the IR lamp 62 is zero (electric power 221).

In the state, a part of the oxygen gas is ionized and dissociated in the plasma 10. The neutral gas and the neutral radicals which are not ionized in the region where the plasma 10 is generated pass through the slit plate 78 so that the wafer 2 is irradiated with the neutral gas and the neutral radicals. The radicals are adsorbed on the surface of the wafer 2 and react with the Co film to generate the Co oxide layer. This process corresponds to a change from a state (a) to a state (b) shown in FIG. 5. Due to the effect of the slit plate 78, ions generated in the plasma 10 hardly enter the wafer 2. Therefore, the oxidation of the Co film mainly isotropically proceeds by the radicals, and a Co oxide layer 302 is generated on a surface of a metal film 300. A thickness of the generated Co oxide layer 302 increases depending on plasma processing time using the oxygen gas and a plasma processing temperature. However, an oxidation amount is saturated when 60 seconds have elapsed at the temperature in this case. Therefore, the time for plasma processing using the oxygen gas is set to 60 seconds.

After the plasma processing time required to form the Co oxide layer has elapsed, the control unit 40 turns off the high frequency electric power supply 20 (discharging electric power 212) and stops the plasma electric discharge. The gas remaining in the processing chamber 1 is exhausted by the exhaust mechanism. The supply of the He gas to the back surface of the wafer is stopped, the valve 52 is opened, and the pressure on the back surface of the wafer 2 is set equal to the pressure in the processing chamber 1. The He gas on the back surface of the wafer is removed, whereby the pressure 230 of the He gas on the back surface of the wafer in FIG. 4 is set to pressure 232. The above is the first step.

Before the oxidation processing in the first step or after the oxidation processing, or before and after the oxidation processing, plasma processing may be performed with a hydrogen gas to reduce a surface of an object to be processed, and an oxidation state of the oxide layer of the film containing Co may be adjusted.

Subsequently, supply of the acetylacetone which is the complexation gas to the processing chamber 1 is started. The controller 40 causes the heater 46 of the complexation gas supplier 47 to vaporize the acetylacetone in the tank 45, and starts supplying an acetylacetone gas from the mass flow controller 50-5 to the processing chamber 1. At this time, a pipe that supplies the vaporized acetylacetone from the complexation gas supplier 47 to the processing chamber 1 is heated in advance so that the acetylacetone does not condense.

The control unit 40 turns on an output of the IR lamp electric power supply 64 to turn on the IR lamp 62 (electric power 222). The IR light emitted from the IR lamp 62 passes through the IR light transmission window 74 and heats the wafer 2. Accordingly, the temperature of the wafer is raised as indicated as a wafer temperature 242 (see the wafer temperature 240 shown in FIG. 4). During the heating and temperature raising process, the acetylacetone changes from physical adsorption to chemical adsorption on the surface of the wafer 2. The wafer temperature 240 reaches 200° C. 35 seconds after the start of the temperature raising when the second step is terminated. In the example, the wafer temperature to be reached is set to 200° C. However, a wafer temperature 243 to be reached may be set in a range of 150° C. to 250° C.

Once the wafer temperature 240 reaches 200° C. (wafer temperature 243), the control unit 40 reduces the output of the IR lamp electric power supply 64 to electric power 223, thereby keeping the temperature of the wafer 2 constant at the temperature 243 for a certain period of time. In this manner, the acetylacetone is continuously supplied in a state where the temperature of the wafer 2 is maintained at 200° C. Pressure is set as 100 Pa, and a flow rate of the acetylacetone is set as 250 ccm. The Co oxide layer reacts with the acetylacetone adsorbed on the surface thereof, so that generation and sublimation removal of a reaction product mainly formed of cobalt acetylacetonate is repeated and the thickness of the Co oxide layer is reduced. The process corresponds to a change from the state (b) to a state (c) shown in FIG. 5. The entire Co oxide layer 302 is removed, so that the etching is stopped and a Co metal layer 303 is exposed.

In the second step and the present step (the third step), the wafer 2 is heated by the electromagnetic wave from the IR lamp 62, so that a surface of the wafer necessarily to be heated can be efficiently warmed. For example, even when there is a temperature difference of about 175° C., the heating can be rapidly completed. Although it is described that the wafer 2 is heated in a state where the wafer 2 is placed on the stage 4, the wafer 2 may be raised from the stage 4 by using a lift pin or the like and irradiated with the IR light (the electromagnetic wave) in a state where the wafer 2 is not in thermal contact with the stage 4. Accordingly, heat transfer from the wafer 2 to the stage 4 can be prevented and the temperature of the wafer 2 can thus be raised to a desired temperature in a shorter time. In this case, the temperature of the wafer 2 may be measured using the light that is emitted from the IR lamp 62, transmits through the wafer 2 and reaches the optical fibers 92-2. A power ratio of the IR lamps 62-1, 62-2 and 62-3 may be controlled based on a radial temperature distribution in a plane of the wafer 2.

Thereafter, the control unit 40 turns off the output of the IR lamp electric power supply 64 (electric power 224) and stops the heating of the wafer 2. The gas remaining in the processing chamber 1 is rapidly exhausted by the exhaust mechanism. Thus, the third step is terminated.

Subsequently, the control unit 40 controls the mass flow controller 50-1 for Ar gas supply and the mass flow controller 50-4 for He gas supply to supply an Ar gas into the processing chamber 1 and supply the He gas between the back surface of the wafer 2 and the stage 4, so that the pressure 230 of the He gas between the back surface of the wafer 2 and the stage 4 is set to a predetermined pressure 233 and the cooling of the wafer 2 is started (temperature 244). The wafer temperature is cooled to 20° C. and time required for the cooling is 30 seconds. Therefore, the fourth step is terminated.

In this manner, in the present embodiment, the oxidation processing in the first step and the complexation and sublimation removal processing in the third step isotropically proceed, so that a height of unevenness of the surface of the metal film 300 decreases to L2 of the Co metal layer 303 after the processing from L1 of an initial Co metal layer 301 as shown in FIG. 5. The cycle including the first to the fourth steps is repeated, so that etching of the metal film 300 can be performed and the unevenness of the surface of the metal film 300 can be flattened.

FIG. 6 shows results of performing the etching processing of the metal film containing Co according to the process flow shown in FIG. 2. A horizontal axis indicates the number of cycles performed, and a vertical axis indicates an etching amount. The etching is terminated when 14 cycles are repeated and a total etching amount of 14.7 nm is obtained. FIG. 6 shows the results of measuring the etching amount upon termination of the cycles of 1, 3, 6, 9, 12, and 14. It can be seen that the etching amount changes substantially linearly in accordance with the number of cycles. In this case, the etching amount of the Co film per cycle, that is, the etching rate is 0.94 nm/cycle.

FIG. 7 shows results of performing the etching processing of the metal film containing Co according to the process flow shown in FIG. 2 by varying the temperature (the oxidation temperature) in the first step. A horizontal axis indicates the oxidation temperatures in the first step and a vertical axis indicates the surface roughness. The oxidation temperatures in the first step are −20° C., 0° C., 25° C., 50° C., 75° C., 100° C., 125° C., 150° C., and 175° C. The cycle number of the processing is 10 and setting conditions and a processing method other than the oxidation temperatures in the first step are the same. However, since the temperature of the third step is set to 200° C., a temperature width for the temperature raising in the second step and a temperature width for the cooling in the fourth step differ depending on the oxidation temperatures in the first step. Accordingly, time required for the temperature raising and the cooling is different.

Surface roughness of nine etched samples produced in the above-described manner is evaluated using an atomic force microscope (AFM). An evaluated area is a square area of 1 μm×1 μm. A root mean square of an unevenness value of a measurement point is set as a value of the surface roughness. In this manner, when the Co oxide layer is formed at a temperature of 100° C. or lower, the surface roughness after 10 cycles of the etching processing is as small as less than 1 nm. On the other hand, when the temperature of forming the Co oxide layer exceeds 100° C., the surface roughness after the etching processing exceeds 1 nm, and the roughness rapidly increases in accordance with the temperature. From the evaluation results, it is shown that the surface roughness after the etching can be controlled by setting the temperature of the first step, that is, the temperature of forming the Co oxide layer, to 100° C. or lower.

REFERENCE SIGN LIST

1 processing chamber
2 wafer
3 electric discharge region
4 wafer stage
5 shower plate
6 top plate
10 plasma
11 base chamber
12 quartz chamber
14 pressure adjustment mechanism
15 pump
16 vacuum exhaust pipe
17 gas dispersion plate
20 high frequency electric power supply
22 matching unit
25 high frequency cut-off filter
30 electrode for electrostatic adsorption
31 DC electric power supply for electrostatic adsorption
34 ICP coil
38 chiller
40 control unit
41 arithmetic unit
45 tank
46 heater
47 complexation gas supplier
50 mass flow controller
51 gas supply unit
52, 53, 54 valve
60 container
62 IR lamp
63 reflection plate
64 IR lamp electric power supply
70 thermocouple
71 thermocouple thermometer
74 IR light transmission window
75 gas flow path
78 slit plate
81 O ring
92 optical fiber
93 external IR light source
94 optical path switch
95 light distributor
96 spectroscope
97 detector
98 optical multiplexer
100 plasma processing apparatus
110 surface of transition metal film (before etching)
111 convex portion
112 concave portion
120 oxide layer
130 transition metal layer-oxide layer interface
140 surface of transition metal film (after etching)

The invention claimed is:

1. An etching method for a transition metal film that is formed on a sample and contains a transition metal element, the etching method comprising:
   a first step of isotropically generating a layer of transition metal oxide on a surface of the transition metal film while a temperature of the sample is maintained at 100° C. or lower;
   a second step of concurrently raising the temperature of the sample to a predetermined temperature of 150° C. or higher and 250° C. or lower and supplying a complexation gas to the layer of transition metal oxide, and chemisorbing and activating materials of the complexation gas absorbed on the surface of the layer of the transition metal oxide which is obtained in the first step;
   a third step of subliming and removing a reactant generated by a reaction between the complexation gas and the transition metal oxide formed in the first step while the temperature of the sample is maintained at 150° C. or higher and 250° C. or lower; and
   a fourth step of cooling the sample.

2. The etching method according to claim 1, wherein the first to the fourth steps are repeated.

3. The etching method according to claim 1, wherein in the first step, the layer of the transition metal oxide is formed by irradiating the transition metal film with an oxygen radical.

4. The etching method according to claim 1, wherein the complexation gas contains a β-diketone.

5. The etching method according to claim 4, wherein the complexation gas contains the β-diketone that contains no halogen element.

6. The etching method according to claim 1, wherein in the second step, the temperature of the sample is raised by an electromagnetic wave.

7. The etching method according to claim 1, wherein the transition metal film contains Co (cobalt).

8. A plasma processing apparatus comprising:
   a plasma source;
   a processing chamber provided with a stage on which a sample is placed, a transition metal film that contains a transition metal element being formed on the sample;
   a gas supply unit that supplies an oxidizing gas to the plasma source;
   a complexation gas supplier that supplies a complexation gas to the processing chamber;
   a slit plate disposed between the plasma source and the stage;
   an exhaust mechanism that exhausts the processing chamber; and
   a control unit, wherein
   the control unit executes:
      a first step of, while a temperature of the sample is maintained at 100° C. or lower, generating a layer of transition metal oxide on a surface of the transition metal film and thereafter exhausting the processing chamber by the exhaust mechanism, the layer of transition metal oxide being generated by generating plasma while the oxidizing gas is supplied from the gas supply unit to the plasma source and irradiating the sample with a neutral oxidizing gas and a neutral radical that pass through the slit plate;
      a second step of concurrently raising the temperature of the sample to a predetermined temperature of 150° C. or higher and 250° C. or lower and supplying the complexation gas from the complexation gas supplier to the processing chamber, and chemisorbing and activating materials of the complexation gas absorbed on the surface of the layer of the transition metal oxide;
      a third step of subliming a reactant generated by a reaction between the complexation gas and the transition metal oxide formed in the first step by maintaining the temperature of the sample at 150° C. or higher and 250° C. or lower and thereafter exhausting the processing chamber by the exhaust mechanism; and
      a fourth step of cooling the sample.

9. The plasma processing apparatus according to claim 8, wherein
   the control unit repeatedly executes the first to the fourth steps.

10. The plasma processing apparatus according to claim 8, further comprising:
    a lamp unit that heats the sample, wherein
    the control unit causes the temperature of the sample to be raised by an electromagnetic wave generated by the lamp unit.

11. The plasma processing apparatus according to claim 10, further comprising:
    a chiller that supplies and circulates a refrigerant in a refrigerant flow path formed inside the stage, wherein
    the control unit controls the chiller to cool the sample.

12. The plasma processing apparatus according to claim 11, further comprising:
    a thermometer that measures a temperature of the stage, wherein
    the control unit controls the lamp unit and the chiller based on the temperature of the stage measured by the thermometer, as well as information on temperature distribution of the sample determined based on wavelength dependency data of an spectral intensity of an electromagnetic wave absorbed by the sample, the sample being irradiated with the electromagnetic wave.

13. The plasma processing apparatus according to claim 11, wherein
    the gas supply unit supplies a cooling gas that cools the sample between the sample and the stage, and
    the control unit causes the gas supply unit to supply the cooling gas in the first step and the fourth step.

14. The plasma processing apparatus according to claim 8, wherein
    the complexation gas contains a β-diketone.

* * * * *